United States Patent
Sumida et al.

(10) Patent No.: US 10,910,474 B2
(45) Date of Patent: Feb. 2, 2021

(54) GROUP III NITRIDE SEMICONDUCTOR SUBSTRATE AND METHOD FOR MANUFACTURING GROUP III NITRIDE SEMICONDUCTOR SUBSTRATE

(71) Applicant: FURUKAWA CO., LTD., Tokyo (JP)

(72) Inventors: Yasunobu Sumida, Tokyo (JP); Yasuharu Fujiyama, Tochigi (JP); Hiroki Goto, Tochigi (JP); Takuya Nakagawa, Tochigi (JP); Yujiro Ishihara, Tochigi (JP)

(73) Assignee: FURUKAWA CO., LTD., Tokyo (JP)

( * ) Notice: Subject to any disclaimer, the term of this patent is extended or adjusted under 35 U.S.C. 154(b) by 24 days.

(21) Appl. No.: 16/470,545

(22) PCT Filed: Dec. 18, 2017

(86) PCT No.: PCT/JP2017/045392
§ 371 (c)(1),
(2) Date: Jun. 17, 2019

(87) PCT Pub. No.: WO2018/117051
PCT Pub. Date: Jun. 28, 2018

(65) Prior Publication Data
US 2019/0348504 A1    Nov. 14, 2019

(30) Foreign Application Priority Data

Dec. 19, 2016    (JP) .................. 2016-245357

(51) Int. Cl.
*H01L 29/04*    (2006.01)
*H01L 29/20*    (2006.01)
(Continued)

(52) U.S. Cl.
CPC .......... *H01L 29/2003* (2013.01); *C30B 29/38* (2013.01); *H01L 21/0237* (2013.01);
(Continued)

(58) Field of Classification Search
CPC ........... H01L 21/0237; H01L 21/02428; H01L 21/02458; H01L 29/2003; H01L 29/045
(Continued)

(56) References Cited

U.S. PATENT DOCUMENTS 6,586,819 B2    7/2003  Matsuoka
8,367,445 B2    2/2013  Okuno
(Continued)

FOREIGN PATENT DOCUMENTS

CN    102479900 B    3/2015
EP     1182697 A2    2/2002
(Continued)

OTHER PUBLICATIONS

Extended European Search Report (EESR) dated Aug. 11, 2020 issued in the corresponding European Patent Application No. 17885108.5.
(Continued)

*Primary Examiner* — Tan T Tran
(74) *Attorney, Agent, or Firm* — Rankin, Hill & Clark LLP

(57) ABSTRACT

A method for manufacturing a group III nitride semiconductor substrate includes a preparation step S10 for preparing a group III nitride semiconductor substrate having a sapphire substrate having a semipolar plane as a main surface, and a group III nitride semiconductor layer positioned over the main surface, in which a <0002> direction of the sapphire substrate and a <10-10> direction of the group III nitride semiconductor layer do not intersect at right angles in a plan view in a direction perpendicular to the main surface, and a growth step S20 for epitaxially growing a group III nitride semiconductor over the group III nitride semiconductor layer.

7 Claims, 10 Drawing Sheets

(51) Int. Cl.
*C30B 29/38* (2006.01)
*H01L 21/02* (2006.01)

(52) U.S. Cl.
CPC .. *H01L 21/02428* (2013.01); *H01L 21/02458* (2013.01); *H01L 29/045* (2013.01)

(58) Field of Classification Search
USPC ..................................... 257/64, 76, E33.003
See application file for complete search history.

(56) References Cited

U.S. PATENT DOCUMENTS

| | | | |
|---|---|---|---|
| 9,627,581 | B2 | 4/2017 | Choe |
| 2002/0033521 | A1 | 3/2002 | Matsuoka |
| 2009/0197118 | A1 | 8/2009 | Nagai et al. |
| 2012/0135557 | A1 | 5/2012 | Okuno |
| 2013/0062739 | A1 | 3/2013 | Yao et al. |
| 2013/0126900 | A1 | 5/2013 | Inoue |
| 2013/0320353 | A1* | 12/2013 | Kryiouk .............. H01L 21/0242 257/76 |
| 2015/0357521 | A1 | 12/2015 | Choe |

FOREIGN PATENT DOCUMENTS

| | | |
|---|---|---|
| JP | 2012160755 A | 8/2012 |
| JP | 2014196230 A | 10/2014 |
| JP | 2015032730 A | 2/2015 |
| JP | 2016012717 A | 1/2016 |

OTHER PUBLICATIONS

International Search Report dated Mar. 6, 2018 filed in PCT/JP2017/045392.
Chinese Office Action (CNOA) dated Nov. 11, 2020 issued in the corresponding Chinese Patent Application No. 201780078733.9.

* cited by examiner (1)

(2)

(3)

EXAMPLE 1

COMPARATIVE EXAMPLE 1

COMPARATIVE EXAMPLE 2

EXAMPLE 1

COMPARATIVE EXAMPLE 1

COMPARATIVE EXAMPLE 2

GROUP III NITRIDE SEMICONDUCTOR SUBSTRATE AND METHOD FOR MANUFACTURING GROUP III NITRIDE SEMICONDUCTOR SUBSTRATE

TECHNICAL FIELD

The present invention relates to a group III nitride semiconductor substrate and a method for manufacturing a group III nitride semiconductor substrate.

BACKGROUND ART

Related techniques are disclosed in Patent Document 1 and Patent Document 2. As disclosed in Patent Document 1 and Patent Document 2, in a case where a device (for example, an optical device, an electronic device, or the like) is formed over the c-plane of a group III nitride semiconductor crystal, the internal quantum efficiency is reduced due to a piezoelectric field. Therefore, attempts are being made to form devices over so-called semipolar planes (planes different from polar planes and non-polar planes).

RELATED DOCUMENT

Patent Document

[Patent Document 1] Japanese Patent Application Publication No. 2012-160755
[Patent Document 2] Japanese Patent Application Publication No. 2016-12717

SUMMARY OF THE INVENTION

Technical Problem

The present inventors have newly discovered that, in a case where a group III nitride semiconductor is grown as a thick film over a substrate, in which a sapphire substrate and a group III nitride semiconductor layer having a semipolar plane as an exposed surface are laminated, over the exposed surface thereof, cracks may occur in the group III nitride semiconductor layer, which may cause the semiconductor substrate layer to be peeled off from the sapphire substrate. In some cases, cracks may also occur on the sapphire substrate side.

The present invention has an object of providing a new technique for growing a group III nitride semiconductor as a thick film over a substrate, in which a sapphire substrate and a group III nitride semiconductor layer having a semipolar plane as an exposed surface are laminated, over the exposed surface thereof.

Solution to Problem

According to the present invention, there is provided a group III nitride semiconductor substrate including a sapphire substrate having a semipolar plane as a main surface, and a group III nitride semiconductor layer positioned over the main surface, in which a <0002> direction of the sapphire substrate and a <10-10> direction of the group III nitride semiconductor layer do not intersect at right angles in a plan view in a direction perpendicular to the main surface.

In addition, according to the present invention, there is provided a method for manufacturing a group III nitride semiconductor substrate, the method including a preparation step of preparing a group III nitride semiconductor substrate having a sapphire substrate having a semipolar plane as a main surface, and a group III nitride semiconductor layer positioned over the main surface, in which a <0002> direction of the sapphire substrate and a <10-10> direction of the group III nitride semiconductor layer do not intersect at right angles in a plan view in a direction perpendicular to the main surface, and a growth step of epitaxially growing a group III nitride semiconductor over the group III nitride semiconductor layer.

In addition, according to the present invention, there is provided a method for manufacturing a group III nitride semiconductor substrate, the method including a sapphire substrate preparation step of preparing a sapphire substrate in which the main surface is a plane obtained by inclining a {10-10} plane at any angle of more than 0.0° and 10.5° or less in a direction in which the {10-10} plane is parallel with an a-plane, a heating step of heating the sapphire substrate while performing a nitriding treatment, a pre-step of supplying a gas including any of Al, Ti, Cu, and V without supplying $NH_3$ over the sapphire substrate after the heating step, a buffer layer forming step of forming a buffer layer over the main surface after the pre-step, and a group III nitride semiconductor layer forming step of forming a group III nitride semiconductor layer over the buffer layer.

Advantageous Effects of Invention

The present invention realizes a new technique for growing a group III nitride semiconductor as a thick film over a substrate, in which a sapphire substrate and a group III nitride semiconductor layer having a semipolar plane as an exposed surface are laminated, over the exposed surface thereof.

BRIEF DESCRIPTION OF THE DRAWINGS

The objects described above, other objects, characteristics, and advantages will become clearer from the preferred embodiments described below and the following associated drawings.

Figure 8:
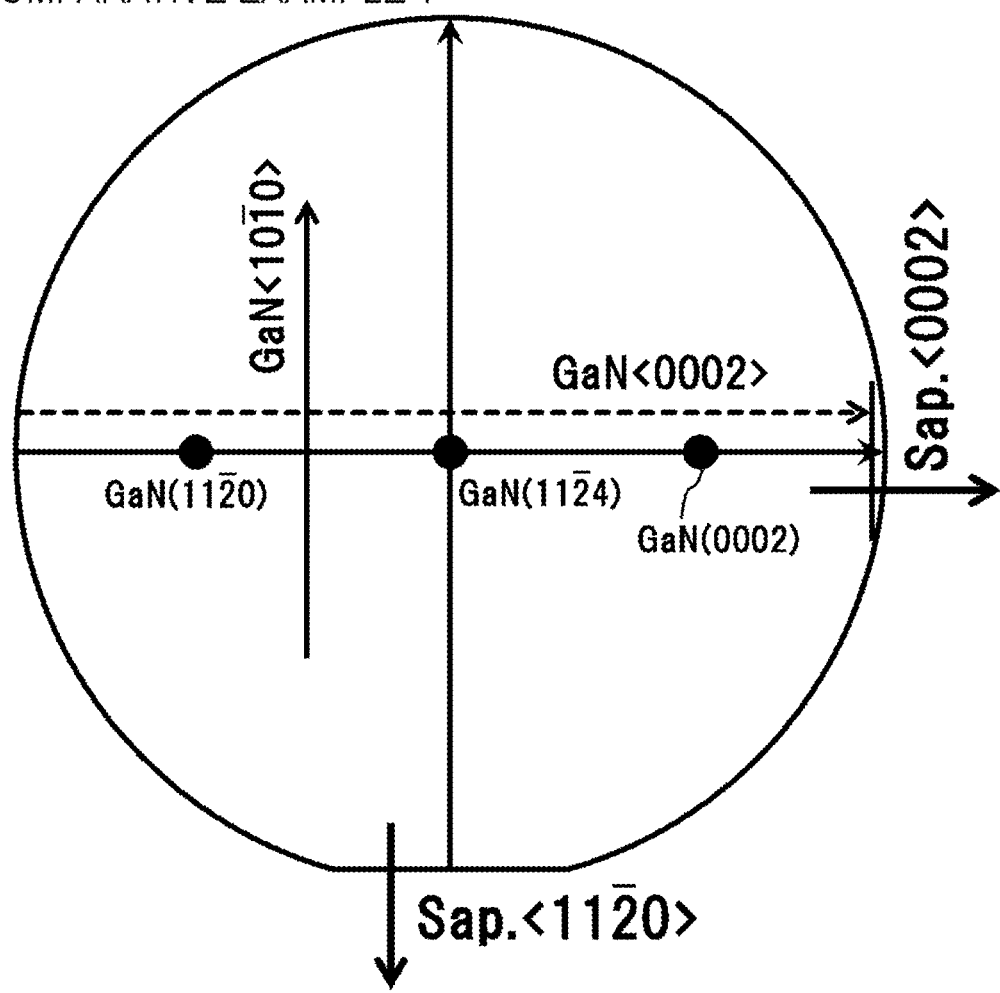

FIG. 8 is a view showing the relationship in a group III nitride semiconductor substrate of Comparative Example 1 between a <0002> direction of a sapphire substrate and a <10-10> direction of a group III nitride semiconductor layer in a plan view in a direction perpendicular to the main surface of the sapphire substrate.

Figure 9:
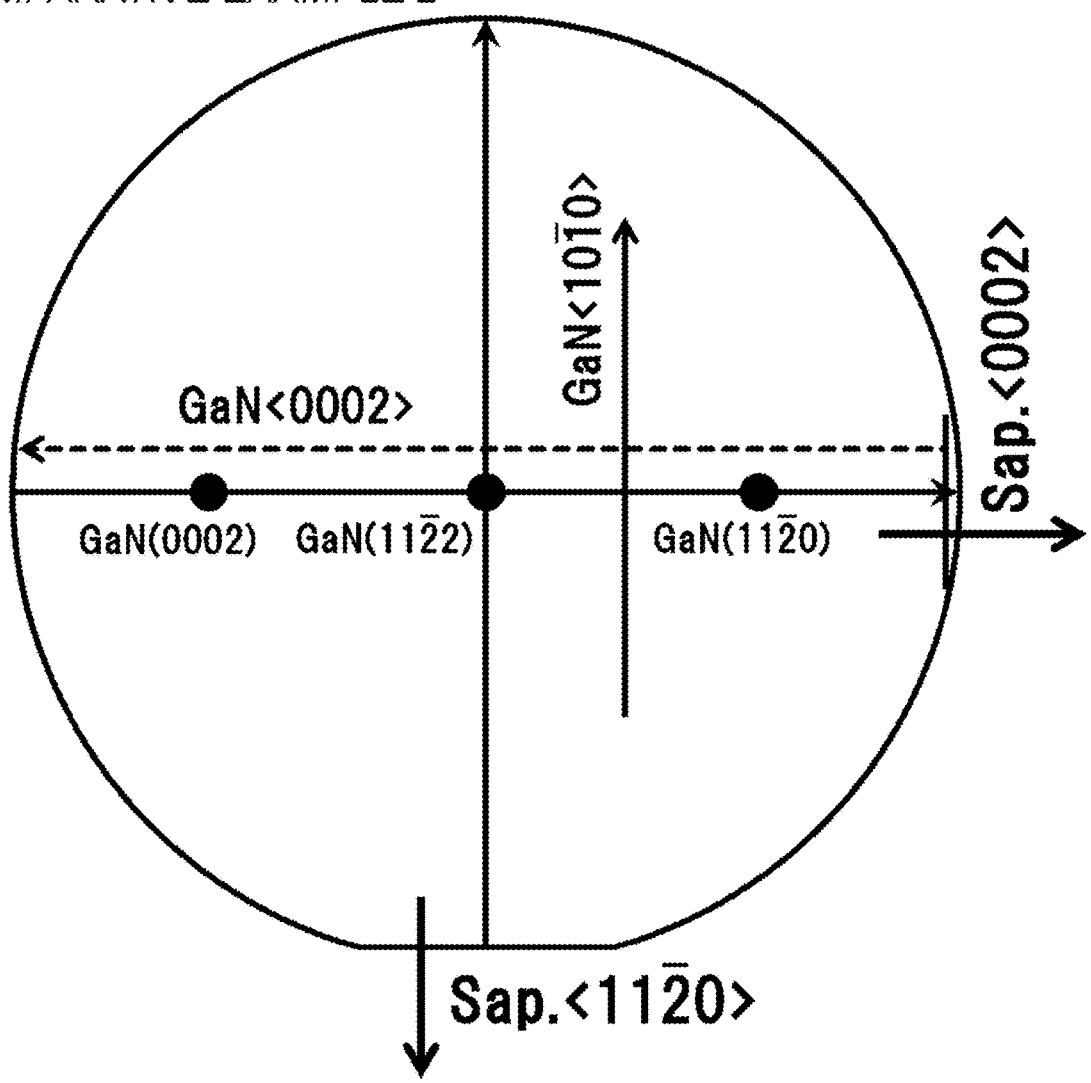

FIG. 9 is a view showing the relationship in a group III nitride semiconductor substrate of Comparative Example 2 between a <0002> direction of a sapphire substrate and a <10-10> direction of a group III nitride semiconductor layer in a plan view in a direction perpendicular to the main surface of the sapphire substrate.

Figure 10:
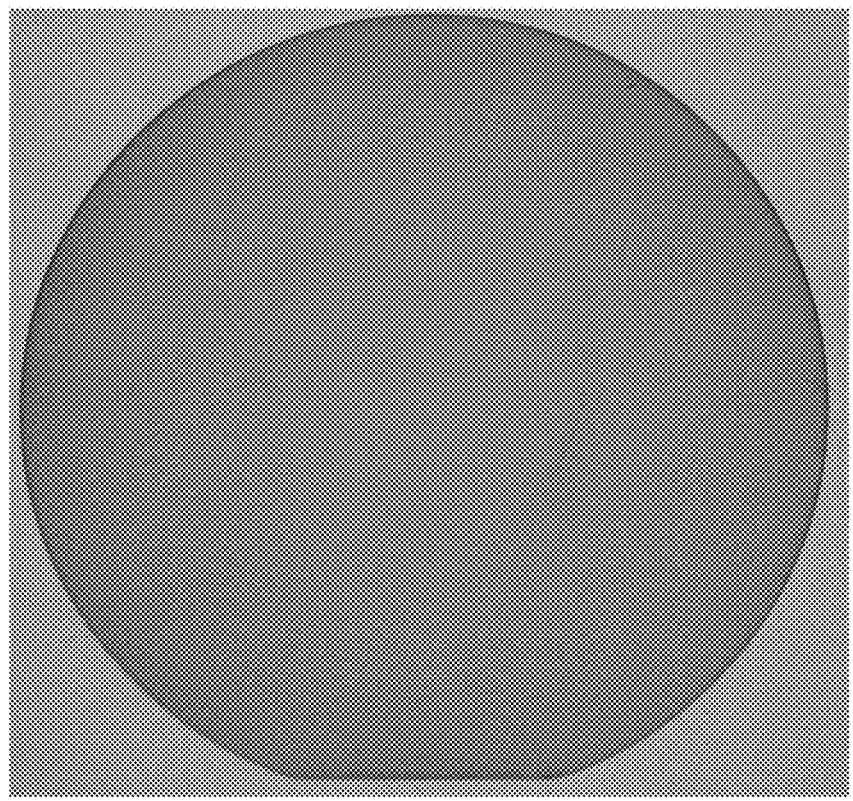

FIG. 10 is a view showing a state after a group III nitride semiconductor layer is grown as a thick film over the group III nitride semiconductor substrate of Example 1.

Figure 11:
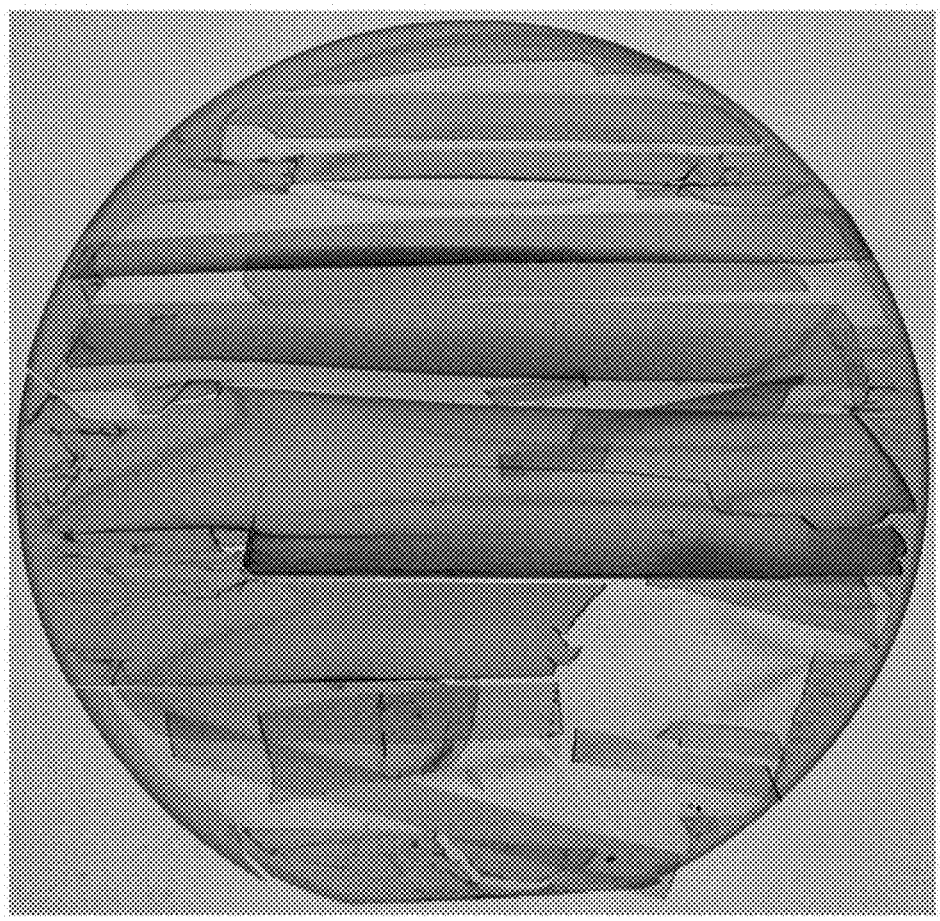

FIG. 11 is a view showing a state after a group III nitride semiconductor layer is grown as a thick film over the group III nitride semiconductor substrate of Comparative Example 1.

Figure 12:
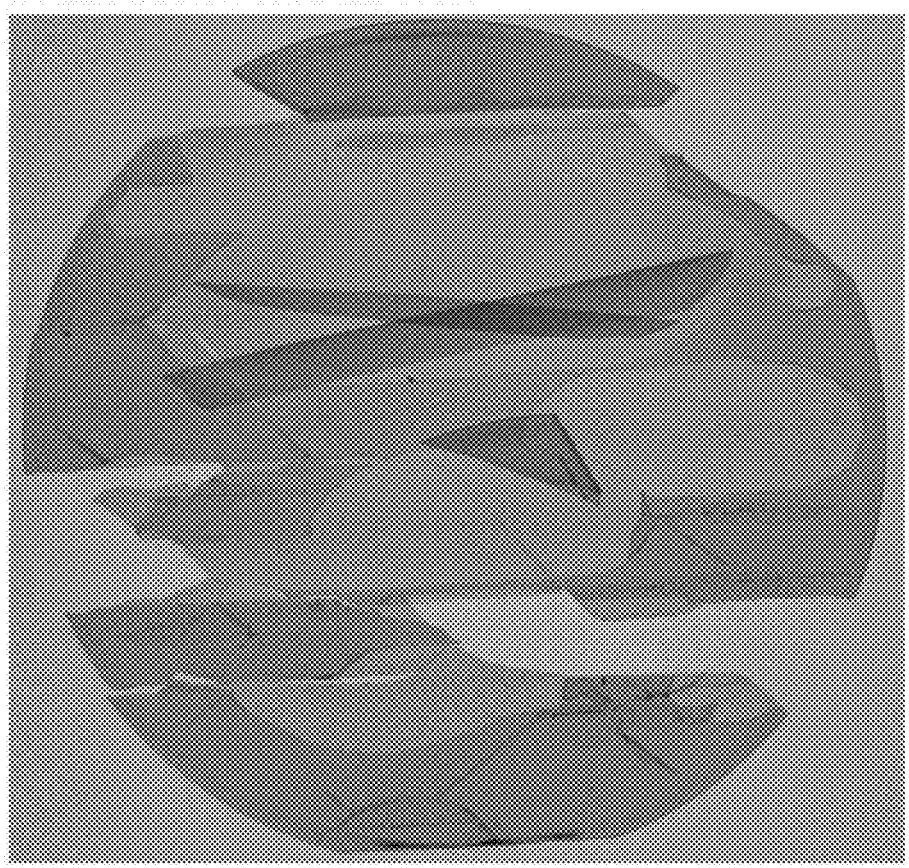

FIG. 12 is a view showing a state after a group III nitride semiconductor layer is grown as a thick film over the group III nitride semiconductor substrate of Comparative Example 2.

DESCRIPTION OF EMBODIMENTS

A description will be given below of embodiments of a group III nitride semiconductor substrate and a method for manufacturing a group III nitride semiconductor substrate of the present invention using the drawings. The drawings are merely schematic views for illustrating the configuration of the invention, and the size, shape, and number of each member, the ratios of sizes of different members, and the like are not limited to the illustrated examples.

Figure 1:
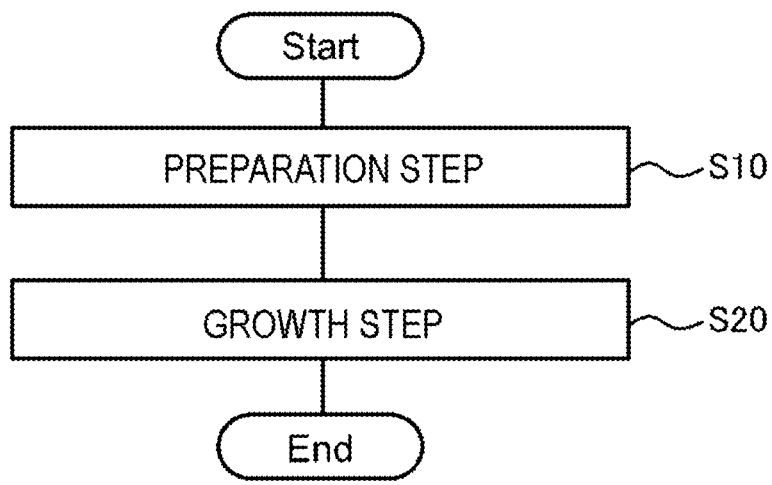
FIG. 1 is a flow chart showing an example of a processing flow of a method for manufacturing a group III nitride semiconductor substrate of the present embodiment.

The flowchart of FIG. 1 shows an example of the processing flow of the method for manufacturing a group III nitride semiconductor substrate of the present embodiment. As illustrated, the method for manufacturing a group III nitride semiconductor substrate of the present embodiment has a preparation step S10 and a growth step S20.

In the preparation step S10, the group III nitride semiconductor substrate (template substrate) in which a sapphire substrate having a semipolar plane as a main surface, and a group III nitride semiconductor layer positioned over the main surface are laminated is prepared. The group III nitride semiconductor substrate has the characteristic that a <0002> direction of a sapphire substrate and a <10-10> direction of the group III nitride semiconductor layer do not intersect at right angles in a plan view in a direction perpendicular to the main surface of the sapphire substrate. The semipolar plane is a plane different from a polar plane (c-plane) and non-polar planes (a-plane and m-plane).

A detailed description will be given of a group III nitride semiconductor substrate (referred to below as "template group III nitride semiconductor substrate") to be prepared in preparation step S10.

Figure 2:
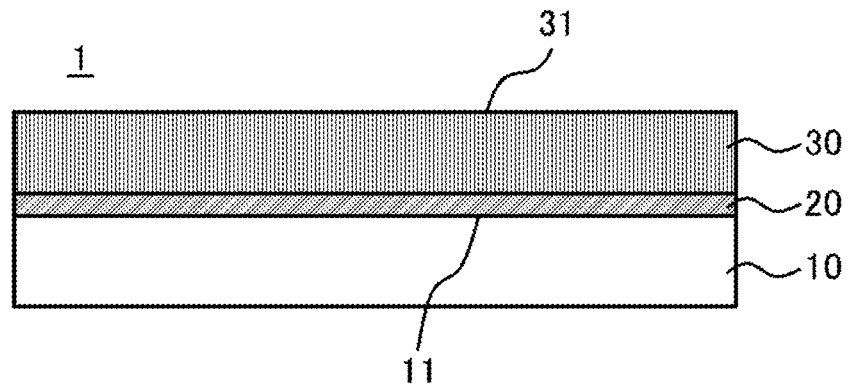
FIG. 2 is a schematic side surface view of an example of a template group III nitride semiconductor substrate 1 of the present embodiment.

FIG. 2 shows a schematic side surface view of an example of the template group III nitride semiconductor substrate 1. As shown in FIG. 2, the template group III nitride semiconductor substrate 1 has a sapphire substrate 10 and a group III nitride semiconductor layer 30. The template group III nitride semiconductor substrate 1 may include other layers in addition to the sapphire substrate 10 and the group III nitride semiconductor layer 30. In the illustrated example, the sapphire substrate 10, a buffer layer 20, and the group III nitride semiconductor layer 30 are laminated in this order.

A layer other than the buffer layer 20 may be interposed between the sapphire substrate 10 and the group III nitride semiconductor layer 30. As described in detail below, in the example of the method for manufacturing the template group III nitride semiconductor substrate 1 shown in FIG. 2, it is possible to include a step of supplying a gas including any of Al, Ti, Cu, and V over a main surface 11 of the sapphire substrate 10, before forming the buffer layer 20 over the sapphire substrate 10. As a result of this step, a film of the above metals, a metal carbide film of aluminum carbide, titanium carbide, copper carbide, or vanadium carbide, which is a reaction film with a hydrocarbon compound such as methane, ethylene, ethane, or the like generated from an organometallic raw material, or the like may or may not be formed between the sapphire substrate 10 and the buffer layer 20. In a case where the metal film is formed, the metal film may be uniformly spread over the entire main surface 11 of the sapphire substrate 10 or may be dotted over the main surface 11.

The main surface 11 of the sapphire substrate 10 is a semipolar plane. For example, the main surface 11 is a plane obtained by inclining the {10-10} plane at any angle of more than 0.0° and 10.5° or less in the direction in which the {10-10} plane is parallel with the a-plane. The thickness of the sapphire substrate 10 is 250 µm or more. In addition, the diameter of the sapphire substrate 10 is 1 inch or more.

The buffer layer 20 is, for example, an AlN layer or a TiN layer. The thickness of the buffer layer 20 is, for example, 20 nm or more and 300 nm or less.

The group III nitride semiconductor layer 30 is positioned over the main surface 11 of the sapphire substrate 10 with the buffer layer 20 interposed therebetween. The group III nitride semiconductor layer 30 is formed of a group III nitride semiconductor crystal (for example, GaN crystal). The thickness of the group III nitride semiconductor layer 30 is, for example, 1 µm or more and 20 µm or less.

A growth plane 31 (exposed surface) of the group III nitride semiconductor layer 30 is a semipolar plane inclined from a −C-plane at 38.0° or more and 53.0° or less to the −a-plane direction and −16.0° or more and 16.0° or less to the m-plane direction. For example, the growth plane 31 is a plane obtained by inclining the {11-23} plane (for example, (−1-12-3) plane) at any angle of −16.0° or more and 16.0° or less in a direction in which the {11-23} is parallel with the m-plane.

Figure 3:
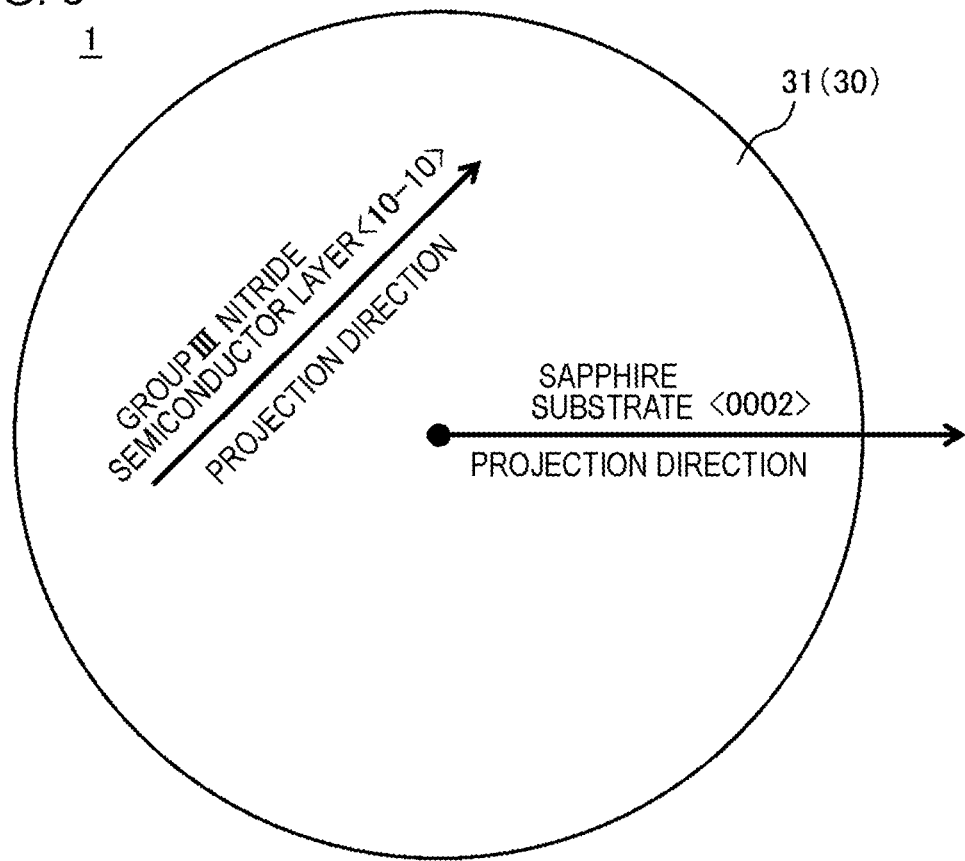
FIG. 3 is a schematic plan view of an example of the template group III nitride semiconductor substrate 1 of the present embodiment.

FIG. 3 shows a schematic plan view of an example of the template group III nitride semiconductor substrate 1. This diagram shows a state in which the template group III nitride semiconductor substrate 1 is observed from the side of the group III nitride semiconductor layer 30 in a plan view in a direction perpendicular to the main surface 11 of the sapphire substrate 10. In the diagram, the <0002> direction of the sapphire substrate 10 and the <10-10> direction of the group III nitride semiconductor layer 30 observed in a plan view are shown. The illustrated arrows indicate the directions in which each of the <0002> direction of the sapphire substrate 10 and the <10-10> direction of the group III nitride semiconductor layer 30 are projected over a plane in parallel with the main surface 11.

As shown in the diagram, the template group III nitride semiconductor substrate 1 has a characteristic that a <0002> direction of the sapphire substrate 10 (a direction in which the <0002> direction is projected over a surface in parallel with the main surface 11) and a <10-10> direction of the group III nitride semiconductor layer 30 (a direction in which the <10-10> direction projected over a surface in parallel with the main surface 11) do not intersect at right angles in a plan view in a direction perpendicular to the main surface 11.

It is only necessary that the angle formed by the <0002> direction of the sapphire substrate 10 and the <10-10> direction of the group III nitride semiconductor layer 30 in a plan view in the direction perpendicular to the main surface 11 is not orthogonal, but, for example, as shown in the following Examples, it is possible to set the angle to 44.5° or more and 45.5° or less.

Figure 4:
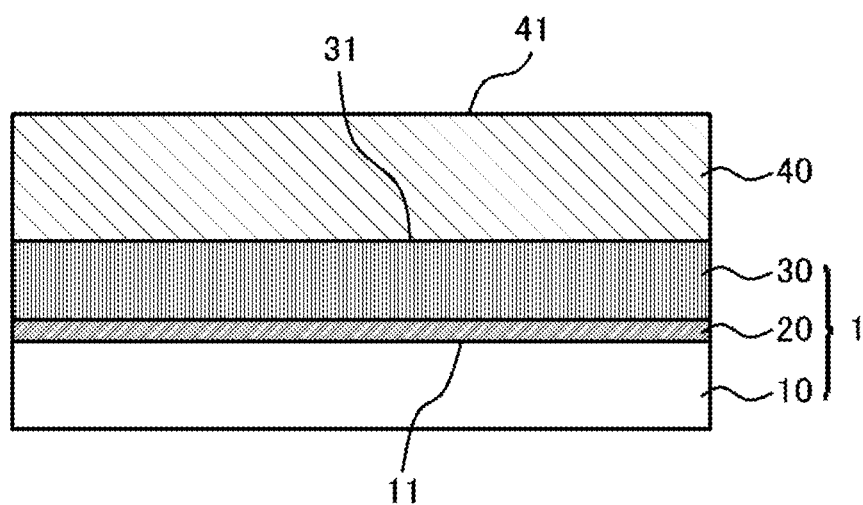
FIG. 4 is a schematic side surface view of an example of the group III nitride semiconductor substrate of the present embodiment obtained by forming a group III nitride semiconductor layer 40 over the template group III nitride semiconductor substrate 1 of the present embodiment.

Returning to FIG. 1, in the growth step S20, a group III nitride semiconductor (for example, GaN crystal) is epitaxially grown over the growth plane 31 of the group III nitride semiconductor layer 30. As a result, as shown in FIG. 4, it is possible to obtain a group III nitride semiconductor substrate in which the group III nitride semiconductor layer 40 is formed over the group III nitride semiconductor layer 30 of the template III group nitride semiconductor substrate 1.

The method for growing the group III nitride semiconductor in the growth step S20 is a matter of design. As the method for growing the group III nitride semiconductor, it is possible to select, for example, vapor phase epitaxial growth (for example, hydride vapor phase epitaxy (HVPE), metal organic chemical vapor deposition (MOCVD), molecular beam epitaxy (MBE)), liquid phase epitaxial growth, solid phase epitaxial growth, and the like. It is possible to set these growth conditions according to the related art.

As shown in the following examples, even if the group III nitride semiconductor is grown as a thick film over the template III group nitride semiconductor substrate 1 of the present embodiment, problems such as cracking and peeling are not easily generated. For this reason, in the growth step S20, it is possible to grow a group III nitride semiconductor as a thick film. It is possible to set the thickness of the group III nitride semiconductor layer 40 to, for example, 50 μm or more and 1000 μm or less, preferably 100 μm or more and 1000 μm or less, and more preferably 500 μm or more and 1000 μm or less.

In the group III nitride semiconductor layer 40 obtained by epitaxial growth over the growth plane 31 of the group III nitride semiconductor layer 30, the growth plane 41 is similarly a semipolar plane. For example, the growth plane 41 is a plane obtained by inclining the {11-23} plane (for example, (−1-12-3) plane) at any angle of more than 0° to 10.0° or less in a direction in which the {11-23} plane is parallel with the m-plane.

As described above, according to the method for manufacturing a group III nitride semiconductor substrate of the present embodiment, over the template III group nitride semiconductor substrate 1 in which the sapphire substrate 10 and group III nitride semiconductor layer 30 are laminated (in addition, the buffer layer 20 or the like may be laminated), it is possible to manufacture a group III nitride semiconductor substrate (refer to FIG. 4) in which the group III nitride semiconductor layer 40 is formed.

In addition, in the manufacturing method of the present embodiment, the group III nitride semiconductor layer 40 is formed over the template III group nitride semiconductor substrate 1 in which the relative orientation relationship between the <0002> direction of the sapphire substrate 10 and the <10-10> direction of the group III nitride semiconductor layer 30 is a characteristic relationship (there is no intersection thereof at right angles in a plan view in a direction perpendicular to the main surface 11).

As shown in the following Examples, in a case where the <0002> direction of the sapphire substrate 10 and the <10-10> direction of the group III nitride semiconductor layer 30 intersect at right angles each other in a plan view in the direction perpendicular to the main surface 11, when the group III nitride semiconductor layer 40 is grown as a thick film of 50 μm or more, the group III nitride semiconductor layer 30 and the group III nitride semiconductor layer 40 are easily cracked. Then, due to these cracks, the group III nitride semiconductor layer 30 and the group III nitride semiconductor layer 40 are separated, and a problem of unintentional peeling from the sapphire substrate 10 is easily generated.

In the case of the present embodiment in which the group III nitride semiconductor layer 40 is formed over the template group III nitride semiconductor substrate 1 in which the <0002> direction of the sapphire substrate 10 and the <10-10> direction of the group III nitride semiconductor layer 30 have the characteristic relationship above, even if the group III nitride semiconductor layer 40 is grown as a thick film of 50 μm or more and 1000 μm or less, cracks are not easily generated in the group III nitride semiconductor layer 30 and the group III nitride semiconductor layer 40.

That is, according to the present embodiment, it is possible to grow a group III nitride semiconductor as a thick film over the exposed surface (the growth plane 31) of the template group III nitride semiconductor substrate 1 in which the sapphire substrate 10 and the group III nitride semiconductor layer 30 having a semipolar plane as the exposed surface (the growth plane 31) are laminated.

It is possible to use the group III nitride semiconductor substrate obtained by the manufacturing method of the present embodiment, for example, as a substrate for forming devices such as optical devices and electronic devices. In addition, in the group III nitride semiconductor substrate obtained by the manufacturing method of the present embodiment, for example, it is possible to separate the group III nitride semiconductor layer 40 from the sapphire substrate 10 or the like by any means, and to use the group III nitride semiconductor layer 40 as a free-standing substrate.

Figure 5:
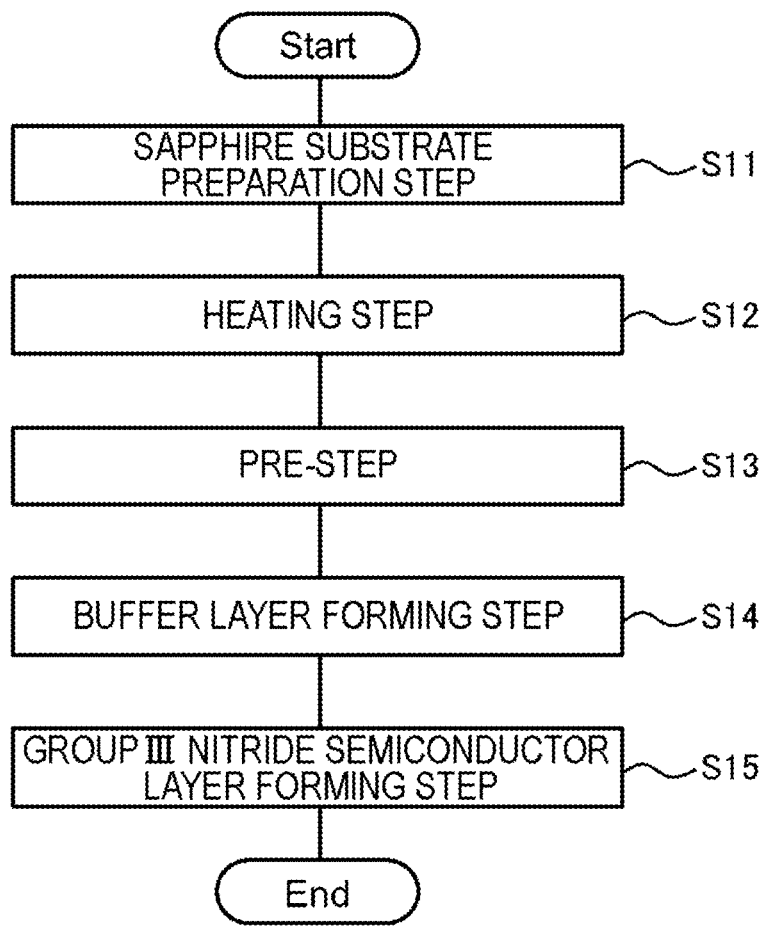
FIG. 5 is a flow chart showing an example of a processing flow of a method for manufacturing the template group III nitride semiconductor substrate 1 of the present embodiment.

Next, a description will be given of an example of a method for manufacturing the template group III nitride semiconductor substrate 1 of the present embodiment. The flow chart of FIG. 5 shows an example of the processing flow of the method for manufacturing a group III nitride semiconductor substrate of the present embodiment. As illustrated, the method for manufacturing the template group III nitride semiconductor substrate 1 of the present embodiment has a sapphire substrate preparation step S11, a heating step S12, a pre-step S13, a buffer layer forming step S14, and a group III nitride semiconductor layer forming step S15. For example, the preparation step S10 shown in FIG. 1 may include these steps.

The method for manufacturing the template group III nitride semiconductor substrate 1 described below is merely an example. As long as the template III group nitride semiconductor substrate 1 prepared in preparation step S10 is provided with the conditions described above, the template III group nitride semiconductor substrate 1 is not limited to being obtained by the above manufacturing method.

Figure 6:
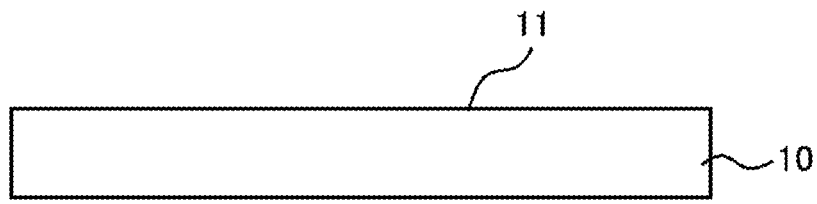
FIG. 6 is a step diagram showing an example of a processing flow of a method for manufacturing the template group III nitride semiconductor substrate 1 of the present embodiment.
Figure 6:
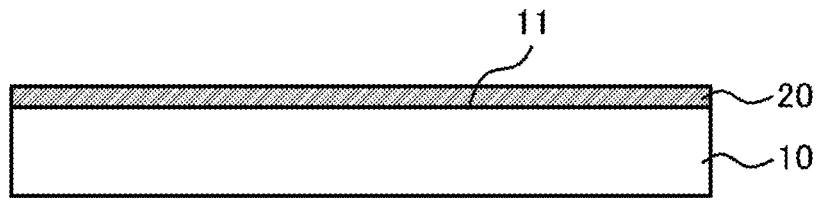
Figure 6:
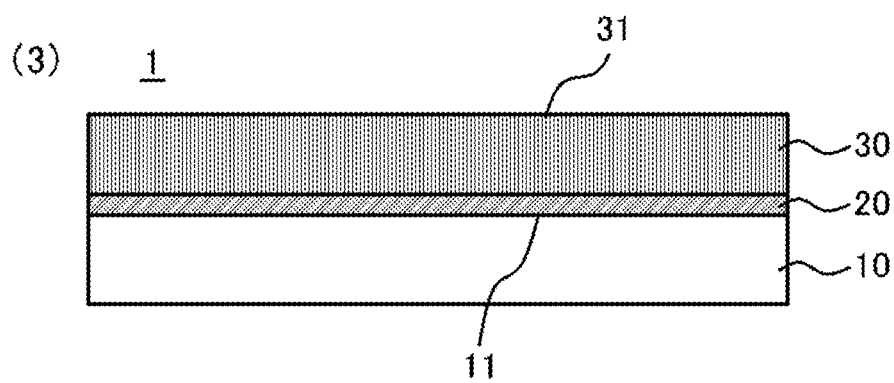

In the sapphire substrate preparation step S11, as shown in FIG. 6(1), the sapphire substrate 10 in which the main surface 11 is a semipolar plane is prepared. For example, in the sapphire substrate preparation step S11, the sapphire substrate 10 is prepared in which the main surface 11 is a plane obtained by inclining the {10-10} plane at any angle of more than 0.0° and 10.5° or less in a direction in which the {10-10} plane is parallel with the a-plane.

The diameter of the sapphire substrate 10 is, for example, 1 inch or more. In addition, the thickness of the sapphire substrate 10 is, for example, 250 µm or more.

In the heating step S12, the sapphire substrate 10 is heated while performing a nitriding treatment. For example, the sapphire substrate 10 is heated under the following conditions.

Temperature: 800° C. or higher and 1200° C. or lower
 Pressure: 50 torr or more and 250 torr or less
 Heat treatment time: 15 minutes
 Carrier gas: $H_2$, $N_2$
 $H_2$ (carrier gas) supply rate: 8.5 slm or more and 9.5 slm or less
 $N_2$ (carrier gas) supply rate: 1.0 slm or more and 2.0 slm or less
 $NH_3$ supply rate: 15 slm or more and 20 slm or less In the pre-step S13, after the heating step S12, a gas (pre-treatment gas) including any of Al, Ti, Cu, and V is supplied over the sapphire substrate 10 and $NH_3$ is not supplied. The pre-treatment gas is, for example, trimethylaluminum or the like. For example, the gas is supplied under the following conditions.

Temperature: 500° C. or higher and 1000° C. or lower
 Pressure: 30 torr or more and 200 torr or less
 Treatment time: 10 seconds
 Carrier gas: $H_2$, $N_2$
 $H_2$ (carrier gas) supply rate: 8.5 slm or more and 9.5 slm or less
 $N_2$ (carrier gas) supply rate: 1.0 slm or more and 2.0 slm or less
 $NH_3$ supply rate: 0 slm
 Pre-treatment gas (example: trimethyl aluminum) supply rate: 85 ccm or more and 95 ccm or less In buffer layer forming step S14, after the pre-treatment step S13 as shown in FIG. 6(2), the buffer layer 20 is formed over the main surface 11 of the sapphire substrate 10. In a case where the buffer layer 20 is an AlN layer, for example, an AlN crystal is epitaxially grown under the following conditions to form the buffer layer 20. As a result, the buffer layer 20 with a film thickness of 20 nm or more and 300 nm or less is formed.

Growth method: MOCVD method
 Growth temperature: 800° C. or higher and 950° C. or lower
 Pressure: 30 torr or more and 200 torr or less
 V/III ratio: 4000 or more and 6000 or less
 TMAl supply rate: 20 ccm or more and 500 ccm or less
 $NH_3$ supply rate: 2.5 slm or more and 7.5 slm or less
 Carrier gas: $H_2$, $N_2$
 $H_2$ (carrier gas) supply rate: 8.5 slm or more and 9.5 slm or less
 $N_2$ (carrier gas) supply rate: 1.0 slm or more and 2.0 slm or less In the group III nitride semiconductor layer forming step S15, as shown in FIG. 6(3), the group III nitride semiconductor layer 30 is formed over the buffer layer 20. For example, a group III nitride semiconductor crystal (for example, GaN) is epitaxially grown under the following growth conditions to form the group III nitride semiconductor layer 30. As a result, the group III nitride semiconductor layer 30 having a thickness of 10 µm or more and 15 µm or less is formed.

Growth method: MOCVD method
 Growth temperature: 800° C. or higher to 1025° C. or lower
 Pressure: 30 torr or more and 200 torr or less
 V/III ratio: 200 or more and 500 or less
 TMGa supply rate: 50 ccm or more and 1000 ccm or less
 $NH_3$ supply rate: 9.0 slm or more and 11.0 slm or less
 Carrier gas: $H_2$, $N_2$
 $H_2$ (carrier gas) supply rate: 13.0 slm or more and 14.0 slm or less
 $N_2$ (carrier gas) supply rate: 1.0 slm or more and 2.0 slm or less Thus, the template group III nitride semiconductor substrate 1 of the present embodiment having the characteristics described above is obtained. By using the template group III nitride semiconductor substrate 1, it is possible to grow a group III nitride semiconductor (the group III nitride semiconductor layer 40) as a thick film over an exposed surface (growth plane 31) of the substrate (template group III nitride semiconductor substrate 1) in which the sapphire substrate 10 and the group III nitride semiconductor layer 30 having a semipolar plane as the exposed surface (the growth plane 31) are laminated.

EXAMPLES (1) Preparation of Group III Nitride Semiconductor Substrate

Template group III nitride semiconductor substrates corresponding to each of Example 1, Comparative Example 1, and Comparative Example 2 were prepared.

Example 1

A template group III nitride semiconductor substrate having a sapphire substrate having a semipolar plane as a main surface, and a group III nitride semiconductor layer positioned over the main surface, in which a <0002> direction of the sapphire substrate and a <10-10> direction of the group III nitride semiconductor layer "do not intersect at right angles" in a plan view in a direction perpendicular to the main surface, was prepared. Specifically, a group III nitride semiconductor substrate was manufactured as follows.

First, the following sapphire substrate was prepared (sapphire substrate preparation step S11).

Main surface (exposed surface): A plane obtained by inclining the (10-10) plane at 2.0° in the direction in which the (10-10) plane is parallel with the a-plane
 Thickness: 430 µm
 Diameter: 2 inches The prepared sapphire substrate was heated under the following conditions (heating step S12).

Temperature: 1000° C. to 1050° C.
 Pressure: 200 torr
 Heat treatment time: 15 minutes
 Carrier gas: $H_2$, $N_2$
 $H_2$ (carrier gas) supply rate: 9 slm
 $N_2$ (carrier gas) supply rate: 1.5 slm
 $NH_3$ supply rate: 20 slm The pre-step S13 was performed on the sapphire substrate after the heating step S12 under the following conditions.

Temperature: 900 to 930° C.
 Pressure: 100 torr
 Treatment time: 10 seconds
 Carrier gas: $H_2$, $N_2$
 $H_2$ (carrier gas) supply rate: 9 slm
 $N_2$ (carrier gas) supply rate: 1.5 slm
 $NH_3$ supply rate: 0 slm Pre-treatment gas (trimethylaluminum) supply rate: 90 sccm After the heat treatment, an AlN layer (buffer layer) having a film thickness of 150 nm was formed over the main surface (exposed surface) of the sapphire substrate under the following conditions.
Growth method: MOCVD method
Growth temperature: 900 to 930° C.
Pressure: 100 torr
V/III ratio: 5184
TMAl supply rate: 90 ccm
$NH_3$ supply rate: 5 slm
Carrier gas: $H_2$, $N_2$
$H_2$ (carrier gas) supply rate: 9 slm
$N_2$ (carrier gas) supply rate: 1.5 slm Thereafter, a GaN layer (a group III nitride semiconductor layer) with a thickness of 15 μm was formed over the buffer layer 20 under the following conditions.
Growth method: MOCVD method
Growth temperature: 900 to 1020° C. (continuous change)
Pressure: 100 torr
V/III ratio: 321
TMGa supply rate: 50 to 500 sccm (continuous change)
$NH_3$ supply rate: 5 to 10 slm (continuous change)
Carrier gas: $H_2$, $N_2$
$H_2$ (carrier gas) supply rate: 13.5 slm
$N_2$ (carrier gas) supply rate: 1.5 slm As described above, the template group III nitride semiconductor substrate of Example 1 was manufactured.

Figure 7:
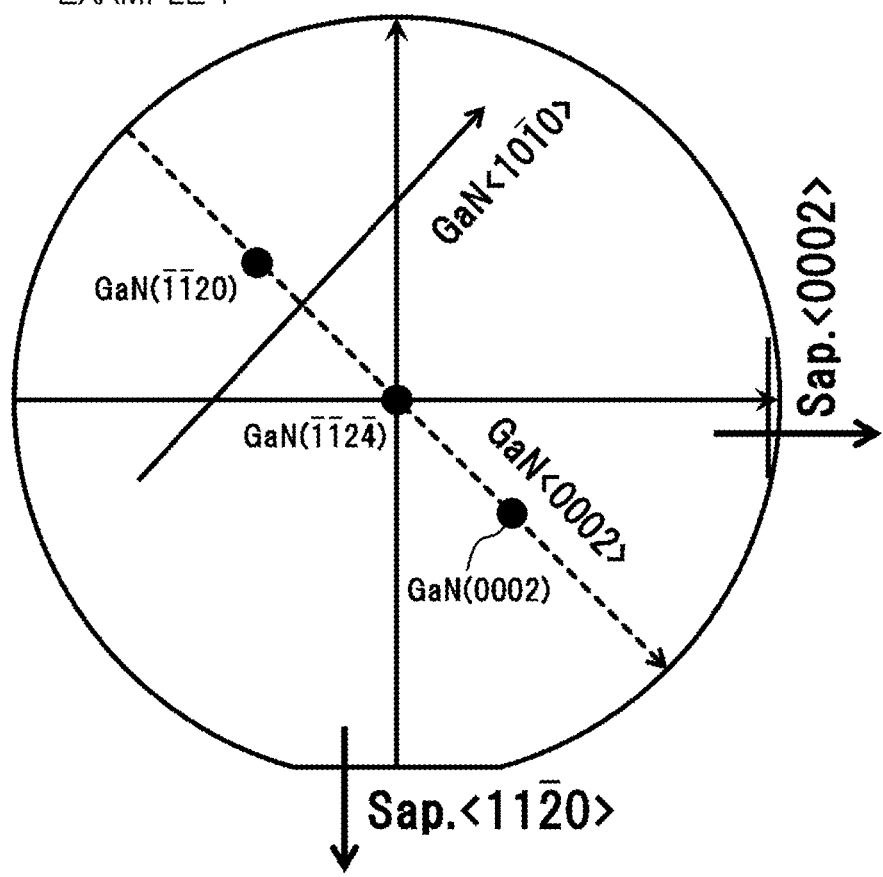
FIG. 7 is a view showing a relationship in a group III nitride semiconductor substrate of Example 1 between a <0002> direction of a sapphire substrate and a <10-10> direction of a group III nitride semiconductor layer in a plan view in a direction perpendicular to the main surface of the sapphire substrate.

FIG. 7 is a view showing the relationship (polarity coordinates measurement results) between a <0002> direction of a sapphire substrate and a <10-10> direction of the group III nitride semiconductor layer (GaN) in a plan view in a direction perpendicular to the main surface of the sapphire substrate. As illustrated, in Example 1, the relationship is "non-intersecting at right angles". The angle formed by the above was 44.5° or more and 45.5° or less.

Comparative Example 1

A template group III nitride semiconductor substrate having a sapphire substrate having a semipolar plane as a main surface, and a group III nitride semiconductor layer positioned over the main surface, in which a <0002> direction of the sapphire substrate and a <10-10> direction of the group III nitride semiconductor layer "intersect at right angles" in a plan view in a direction perpendicular to the main surface, was prepared.

Specifically, using a sapphire substrate in which the main surface (exposed surface) is a plane obtained by inclining the (10-10) plane at 2.0° in the direction in which the (10-10) plane is parallel with the first surface, a template group III nitride semiconductor substrate was manufactured with the buffer layer forming step S14 and the group III nitride semiconductor layer forming step S15 set to the following growth conditions. The heating step S12 and the pre-step S13 were the same as in Example 1.

Buffer layer forming step S14
Growth method: MOCVD method
Growth temperature: 1050 to 1075° C.
Pressure: 100 torr
V/III ratio: 5184
TMAl supply rate: 90 ccm
$NH_3$ supply rate: 5 slm
Carrier gas: $H_2$, $N_2$
$H_2$ (carrier gas) supply rate: 9 slm
$N_2$ (carrier gas) supply rate: 1.5 slm Group III nitride semiconductor layer forming step S15
Growth method: MOCVD method
Growth temperature: 1075 to 1100° C. (continuous change)
Pressure: 100 torr
V/III ratio: 321
TMGa supply rate: 50 to 500 sccm (continuous change)
$NH_3$ supply rate: 5 to 10 slm (continuous change)
Carrier gas: $H_2$, $N_2$
$H_2$ (carrier gas) supply rate: 13.5 slm
$N_2$ (carrier gas) supply rate: 1.5 slm FIG. 8 shows the relationship (polarity coordinates measurement results) between a <0002> direction of a sapphire substrate and a <10-10> direction of the group III nitride semiconductor layer (GaN) in a plan view in a direction perpendicular to the main surface of the sapphire substrate. As illustrated, in Comparative Example 1, the relationship is "intersecting with each other at right angles".

Comparative Example 2

A template group III nitride semiconductor substrate having a sapphire substrate having a semipolar plane as a main surface, and a group III nitride semiconductor layer positioned over the main surface, in which a <0002> direction of the sapphire substrate and a <10-10> direction of the group III nitride semiconductor layer "intersect at right angles" in a plan view in a direction perpendicular to the main surface, was prepared.

Specifically, using a sapphire substrate having a main surface (exposed surface) obtained by inclining the (10-10) plane at 5.0° in the direction in which the (10-10) plane is parallel with the a-plane, a template group III nitride semiconductor substrate was manufactured with the same manufacturing method as Comparative Example 1.

FIG. 9 shows the relationship (polarity coordinates measurement results) between a <0002> direction of a sapphire substrate and a <10-10> direction of the group III nitride semiconductor layer (GaN) in a plan view in a direction perpendicular to the main surface of the sapphire substrate. As illustrated, in Comparative Example 2, the relationship is "intersecting each other at right angles".

(2) "Thick Film Growth of Group III Nitride Semiconductor Layer"

Over each of the template group III nitride semiconductor substrates of Example 1 and Comparative Example 1 and Comparative Example 2 prepared in (1), a GaN layer having a film thickness of 200 μm was formed under the following conditions.
Growth method: HVPE method
Growth temperature: 1040° C.
Pressure: 985 hPa
V/III ratio: 10
GaCl supply rate: 200 sccm
$NH_3$ supply rate: 2 slm
Carrier gas: $H_2$
$H_2$ (carrier gas) supply rate: 8 slm FIG. 10 to FIG. 12 show the appearance of group III nitride semiconductor substrates in which a GaN layer was grown as a thick film over a template group III nitride semiconductor substrate. FIG. 10 shows the group III nitride semiconductor substrate of Example 1, FIG. 11 shows Comparative Example 1, and FIG. 12 shows Comparative Example 2.

From FIG. 10 to FIG. 12, no cracks are generated in the group III nitride semiconductor substrate in Example 1. On the other hand, in Comparative Example 1 and Comparative Example 2, it was confirmed that cracks were generated in the group III nitride semiconductor layer, which caused parts to peel off from the sapphire substrate. Cracks were generated in the group III nitride semiconductor layer starting from the m-plane which is the cleavage plane of GaN.

In addition, in Comparative Example 1 and Comparative Example 2, cracks were also generated in parts of the sapphire substrate.

From the above results, between a case where a group III nitride semiconductor is grown as a thick film over a template group III nitride semiconductor substrate having a sapphire substrate having a semipolar plane as a main surface, and a group III nitride semiconductor layer positioned over the main surface, in which a <0002> direction of the sapphire substrate and a <10-10> direction of the group III nitride semiconductor layer do not intersect at right angles in a plan view in a direction perpendicular to the main surface, and a case where a group III nitride semiconductor is grown as a thick film over a template group III nitride semiconductor substrate in which the above intersect at right angles, it is understood that problems such as cracks or peeling are less likely to occur when growing a group III nitride semiconductor as a thick film over a template group III nitride semiconductor substrate in which the above do not intersect at right angles.

In addition, according to the manufacturing method of Example 1, it is understood that it is possible to manufacture a template group III nitride semiconductor substrate having a sapphire substrate having a semipolar plane as a main surface, and a group III nitride semiconductor layer positioned over the main surface, in which a <0002> direction of the sapphire substrate and a <10-10> direction of the group III nitride semiconductor layer do not intersect at right angles in a plan view in a direction perpendicular to the main surface.

Examples of reference forms are given below.

1. A group III nitride semiconductor substrate including:
a sapphire substrate having a semipolar plane as a main surface; and
a group III nitride semiconductor layer positioned over the main surface,
in which a <0002> direction of the sapphire substrate and a <10-10> direction of the group III nitride semiconductor layer do not intersect at right angles in a plan view in a direction perpendicular to the main surface.

2. The group III nitride semiconductor substrate according to 1,
in which the main surface is a plane obtained by inclining a {10-10} plane at any angle of more than 0.0° and 10.5° or less in a direction in which the {10-10} plane is parallel with an a-plane, and
the group III nitride semiconductor layer has a semipolar plane inclined from a —C-plane at 38.0° or more and 53.0° or less to a -a-plane direction and at −16.0° or more and 16.0° or less to a m-plane direction as an exposed surface.

3. The group III nitride semiconductor substrate according to 1 or 2, further including:
a group III nitride semiconductor layer with a film thickness of 50 μm or more and 1000 μm or less over the group III nitride semiconductor layer.

4. A method for manufacturing a group III nitride semiconductor substrate, the method including:
a preparation step of preparing a group III nitride semiconductor substrate having a sapphire substrate having a semipolar plane as a main surface, and a group III nitride semiconductor layer positioned over the main surface, in which a <0002> direction of the sapphire substrate and a <10-10> direction of the group III nitride semiconductor layer do not intersect at right angles in a plan view in a direction perpendicular to the main surface; and
a growth step of epitaxially growing a group III nitride semiconductor over the group III nitride semiconductor layer.

5. The method for manufacturing a group III nitride semiconductor substrate according to 4,
in which, in the growth step, a group III nitride semiconductor layer with a film thickness of 50 μm or more and 1000 μm or less is formed over the group III nitride semiconductor layer.

6. The method for manufacturing a group III nitride semiconductor substrate according to 4 or 5,
in which the preparation step includes
a sapphire substrate preparation step of preparing a sapphire substrate in which the main surface is a plane obtained by inclining a {10-10} plane at any angle of more than 0.0° and 10.5° or less in a direction in which the {10-10} plane is parallel with an a-plane;
a heating step of heating the sapphire substrate while performing a nitriding treatment;
a pre-step of supplying a gas including any of Al, Ti, Cu, and V without supplying NH$_3$ over the sapphire substrate after the heating step;
a buffer layer forming step of forming a buffer layer over the main surface after the pre-step; and
a group III nitride semiconductor layer forming step of forming a group III nitride semiconductor layer over the buffer layer.

7. The method for manufacturing a group III nitride semiconductor substrate according to 6,
in which, in the buffer layer forming step, the buffer layer is formed at a growth temperature of 800° C. or higher and 950° C. or lower.

8. A method for manufacturing a group III nitride semiconductor substrate, the method including:
a sapphire substrate preparation step of preparing a sapphire substrate in which the main surface is a plane obtained by inclining a {10-10} plane at any angle of more than 0.0° and 10.5° or less in a direction in which the {10-10} plane is parallel with an a-plane;
a heating step of heating the sapphire substrate while performing a nitriding treatment;
a pre-step of supplying a gas including any of Al, Ti, Cu, and V without supplying NH$_3$ over the sapphire substrate after the heating step;
a buffer layer forming step of forming a buffer layer over the main surface after the pre-step; and
a group III nitride semiconductor layer forming step of forming a group III nitride semiconductor layer over the buffer layer.

9. The method for manufacturing a group III nitride semiconductor substrate according to 8,
in which, in the buffer layer forming step, the buffer layer is formed at a growth temperature of 800° C. or higher and 950° C. or lower.

This application claims priority based on Japanese Patent Application No. 2016-245357 filed on Dec. 19, 2016, the entire disclosure of which is incorporated herein.

The invention claimed is:
1. A group III nitride semiconductor substrate comprising:
a sapphire substrate having a semipolar plane as a main surface; and a group III nitride semiconductor layer positioned over the main surface, wherein a <0002> direction of the sapphire substrate and a <10-10> direction of the group III nitride semiconductor layer do not intersect at right angles in a plan view in a direction perpendicular to the main surface, wherein the main surface is a plane obtained by inclining a {10-10} plane at an angle in a range of more than 0.0° and 10.5° or less in a direction in which the {10-10} plane is parallel with an a-plane, and the group III nitride semiconductor layer has a semipolar plane inclined from a −C-plane at 38.0° or more and 53.0° or less to a −a-plane direction and at −16.0° or more and 16.0° or less to a m-plane direction as an exposed surface.

2. The group III nitride semiconductor substrate according to claim 1, further comprising:

a group III nitride semiconductor with a film thickness of 50 μm or more and 1000 μm or less over the group III nitride semiconductor layer.

3. A method for manufacturing a group III nitride semiconductor substrate, the method comprising:

a preparation step of preparing a group III nitride semiconductor substrate having a sapphire substrate having a semipolar plane as a main surface, and a group III nitride semiconductor layer positioned over the main surface, in which a <0002> direction of the sapphire substrate and a <10-10> direction of the group III nitride semiconductor layer do not intersect at right angles in a plan view in a direction perpendicular to the main surface; and a growth step of epitaxially growing a group III nitride semiconductor over the group III nitride semiconductor layer, wherein the preparation step comprises a sapphire substrate preparation step of preparing the sapphire substrate in which the main surface is a plane obtained by inclining a {10-10} plane at an angle in a range of more than 0.0° and 10.5° or less in a direction in which the {10-10} plane is parallel with an a-plane; a heating step of heating the sapphire substrate while performing a nitriding treatment; a pre-step of supplying a gas including at least one of Al, Ti, Cu, and V without supplying NH$_3$ over the sapphire substrate after the heating step; a buffer layer forming step of forming the buffer layer over the main surface after the pre-step; and a group III nitride semiconductor layer forming step of forming the group III nitride semiconductor layer over the buffer layer.

4. The method for manufacturing a group III nitride semiconductor substrate according to claim 3, wherein, in the growth step, a group III nitride semiconductor with a film thickness of 50 μm or more and 1000 μm or less is formed over the group III nitride semiconductor layer.

5. The method for manufacturing a group III nitride semiconductor substrate according to claim 3, wherein, in the buffer layer forming step, the buffer layer is formed at a growth temperature of 800° C. or higher and 950° C. or lower.

6. A method for manufacturing a group III nitride semiconductor substrate, the method comprising:

a sapphire substrate preparation step of preparing a sapphire substrate in which the main surface is a plane obtained by inclining a {10-10} plane at an angle in a range more than 0.0° and 10.5° or less in a direction in which the {10-10} plane is parallel with an a-plane;

a heating step of heating the sapphire substrate while performing a nitriding treatment;

a pre-step of supplying a gas including at least one of Al, Ti, Cu, and V without supplying NH$_3$ over the sapphire substrate after the heating step;

a buffer layer forming step of forming the buffer layer over the main surface after the pre-step; and a group III nitride semiconductor layer forming step of forming the group III nitride semiconductor layer over the buffer layer, wherein a <0002> direction of the sapphire substrate and a <10-10> direction of the group III nitride semiconductor layer do not intersect at right angles in a plan view in a direction perpendicular to the main surface.

7. The method for manufacturing a group III nitride semiconductor substrate according to claim 6, wherein, in the buffer layer forming step, the buffer layer is formed at a growth temperature of 800° C. or higher and 950° C. or lower.

* * * * *